United States Patent [19]

Solomon

[11] Patent Number: 4,910,562
[45] Date of Patent: Mar. 20, 1990

[54] FIELD INDUCED BASE TRANSISTOR

[75] Inventor: Paul M. Solomon, Yorktown Heights, N.Y.

[73] Assignee: International Business Machines Corporation, Armonk, N.Y.

[21] Appl. No.: 371,849

[22] Filed: Apr. 26, 1982

[51] Int. Cl.[4] .............................................. H01L 29/80
[52] U.S. Cl. ........................................ 357/22; 357/16; 357/34
[58] Field of Search .......................... 357/16, 34, 4, 22

[56] References Cited

U.S. PATENT DOCUMENTS

| | | | |
|---|---|---|---|
| 3,209,215 | 9/1965 | Esaki | 317/234 |
| 3,234,057 | 2/1966 | Anderson | 357/16 |
| 3,445,734 | 5/1969 | Pecoraro et al. | 357/16 |
| 4,000,506 | 12/1976 | Hirai et al. | 357/16 |
| 4,075,651 | 2/1978 | James | 357/22 |
| 4,366,493 | 12/1982 | Brascau et al. | 357/22 |
| 4,410,903 | 10/1983 | Wieder | 357/16 |
| 4,414,557 | 11/1983 | Amemiya et al. | 357/16 |
| 4,424,525 | 1/1984 | Mimura | 357/22 MD |

FOREIGN PATENT DOCUMENTS 36501 9/1981 European Pat. Off. .............. 357/16

OTHER PUBLICATIONS

IBM Technical Disclosure Bulletin by L. Esaki; vol. 7 #5 "Three Terminal Tunneling Device Using Heterojunction" Oct. 64.
Solid State Electronics, vol. 15, #12, Dec. 1972, pp. 1339-1343 "GaAs-GaAlAs" Heterojunction Transistor for High Frequency Oge. Physics of Semiconductor Devices by Size, 1981 The Schottkl Effect p. 250.
J. Katz et al., "Monolithic . . . And Laser, " Apply. Phys. Lett., vol. 37 #2, Jul. 15, 1980, pp. 211-213.
W. Dumke et al, "Heterostructure . . . Hot Electron Transistor," IBM Tech. Discl. Bull., vol. 24 #7A, Dec. 1981, pp. 3229-3231.
Proceedings of the IRE, vol. 50, p. 1527 (1962).

Primary Examiner—Joseph E. Clawson, Jr.
Attorney, Agent, or Firm—Thomas J. Kilgannon

[57] ABSTRACT

A field induced base ballistic majority carrier transfer transistor is constructed of two regions of different bandgap semiconductors, each region having the same conductivity type but with the region with the smaller bandgap having a lower conductivity. An accumulation layer in the small bandgap semiconductor adjacent the larger bandgap semiconductor is produced by the bias voltage and serves as the base of the device. A source of emitted carriers is provided by a third region of higher conductivity on the external portion of the smaller bandgap region.

9 Claims, 2 Drawing Sheets

FIG. 2.1
ZERO BIAS
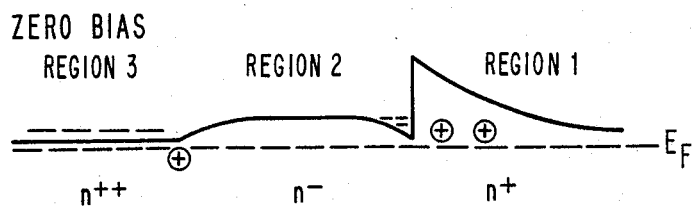
FIG. 2.2
SMALL FORWARD BIAS
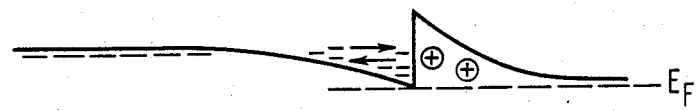
FIG. 2.3
LARGER FORWARD BIAS
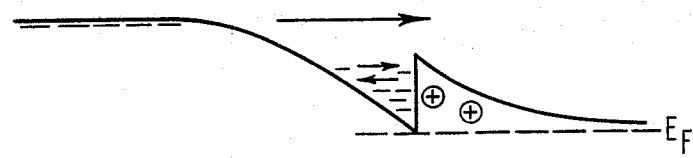

FIELD INDUCED BASE TRANSISTOR

TECHNICAL FIELD

The technical field of the invention is that of semiconductor devices that perform amplification wit wide bandwidth and switching in the speed range of the order of 10-12 seconds.

BACKGROUND ART

As performance advantages in semiconductor devices are identified the speed of response in achieving these devices has been limited. Efforts have been undertaken to reduce the dimensions of the devices and to increase the carrier velocity so as to reduce the transit time of the careers and thereby improve the speed of response. With such efforts, however, have come difficulty in manufacture and serious restrictions on the impressed voltages.

One particularly high seed device was reported in Proceedings of the IRE Vol. 50, p. 1527, 1962. The device was composed of two Schottky barrier diodes back-to-back on a metal base. The device however was limited in that a long traverse time was required for the carriers to pass through the depletion layer in the emitter and also a long capacitive charging time was required for the emitter rectifying contacts.

As the art further developed, an improved structure appeared in the art as is described in copending patent application Ser. No. 118,171 (now abandoned) filed Feb. 4, 1980 wherein a two-stage emitter is provided, in which in the first stage there is a high density of carriers and the second stage which is adjacent to a high conductivity base there is a low barrier. The high conductivity base is of the order of the man free path of an electron.

BRIEF DESCRIPTION OF THE DRAWINGS

FIGS. 2.1, 2.2 and 2.3 are dimensionally correlated band energy diagrams of the regions of the device of FIG. 1 under the influence of bias.

DISCLOSURE INVENTION

The structure of the invention employs a field induced layer between two semiconductor regions of the same conductivity type but of different conductivity level to serve as a base region. The layer is produced by the field of the operating electrical bias that is applied to the device. The layer is of the order of the mean free path of an electron so that ballistic type performance is achieved in which the carriers go from the emitter region to the collector region of the device by drift rather than by diffusion.

Figure 1:
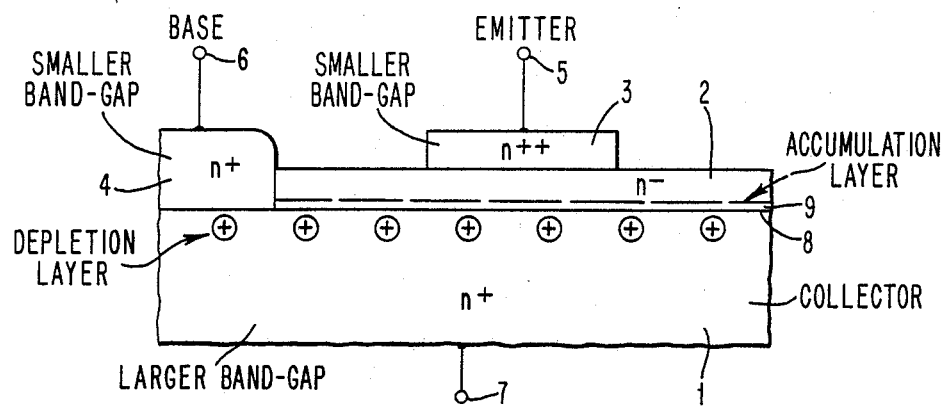
FIG. 1 is a schematic illustration of the structure of the invention.

The device structure of the invention is shown in FIG. 1. The structure has a high conductivity larger bandgap region 1 on which there is an epitaxial smaller bandgap region 2 having a lower conductivity. The region 2 is fairly thin and in turn has epitaxial therewith a region 3 of higher conductivity also with a smaller bandgap than the region 1. A higher conductivity portion 4 of the region 2 serves as an electrode to what will be the base under the influence of bias. Emitter, base and collector external electrical connections 5, 6 and 7, respectively, are shown. For purposes of facilitating explanation, n conductivity type will be used in the description with higher and lower conductivity being shown as + or − respectively, although in the light of the principles set forth, it will be readily apparent to one skilled in the art that p conductivity type can be employed with appropriate adjustments.

Under the influence of bias, at an interface 8 where the epitaxial smaller bandgap region 2 joins the larger bandgap region 1, there will be a depletion layer in the region 1 that is shown as a series of plus circles. There will also be a corresponding accumulation layer 9 in the small bandgap region 2 side of the interface 8. The structure of the invention as labeled in FIG. 1 has the larger bandgap region serving as the collector. The accumulation layer 9 in the smaller bandgap region serves as the base region to which the external circuit contact 4 is provided. The emitter region is made up of two parts. The region 3 is of still higher conductivity shown as $n^{++}$, thereby providing a large sink of electrons which electrons encounter a small barrier at the low conductivity region 2 to the accumulation region 9. The accumulation region 9 serves as the base with a thickness dependent on the material specification and the bias and is of the order of the mean free path of an electron.

Thus, the structure has a high speed, ballistic conductivity type base produced by a field from the operating potentials.

BEST MODE FOR CARRYING OUT THE INVENTION

Continuing to refer to FIG. 1, region 1 will serve as the collector having the larger bandgap material and may be, for example, GaAlAs. The conductivity of the collector region 1 is moderately high, $n^+$, such as occurs with arsenic doping on the order of $10^{17}$ atoms per cc.

At the interface 8, the epitaxial region 2 of a smaller bandgap semiconductor joins the region 1. The region 2 may be GaAs and has a lower n conductivity such as by arsenic doping of the order of $10^{15}$ atoms per cc.

The thickness of the region 2 is of the order of 1,000 Angstroms. A higher conductivity region 3 shown as $n^{++}$ serves as part of the emitter. The region 3 has a smaller bandgap than region 1 and the material GaAs is satisfactory. The region 3 is to provide a large source of carriers for the emitter of the device. The $n^{++}$ can be provided by doping of the order of $10^{18}$ atoms per cc with arsenic. The ohmic contact 4 to the accumulation layer 9 which will serve as a base may be locally doped with arsenic to the order of $10^{17}$ atoms per cc. The effect of bias on the structure of FIG. 1 as shown in the correlated FIGS. 2.1, 2.2 and 2.3, is that there is a spillover of electrons from the wide bandgap collector 1 and from the heavily doped emitter 3 which converts the initial high resistivity of the region 2 in the vicinity of the interface 8 and produce an accumulation layer 9 at the interface 8 which is ohmically connected through the region 4 to the external base contact 6.

Referring to FIG. 2.1 for zero bias, in the $n^{++}$ region 3 corresponding to the carrier sink part of the emitter, a large number of carriers are shown. On the other side of the $n^-$ region 2, at the interface with the $n^+$ region 1, the depletion region is shown in the $n^+$ region adjacent the barrier as the plus signs and the presence of negative carriers in the accumulation region 9 is shown as a number of minus signs in the potential well at the location of the interface.

Referring next to FIG. 2.2, under the influence of small forward bias additional electrons are injected from the large supply constructed in the n++ region 3 part of the emitter. However, the current flow at low bias is small since these electrons cannot escape over the heterojunction barrier that appears at the interface 8 due to the difference in bandgap between regions 1 and 2 and diffuse laterally to the base contact 4.

Referring next to FIG. 2.3, under larger forward bias at emitter base voltages exceeding the heterojunction barrier height, electrons will transit the base region and be collected by the collector since the energy at injection is now higher than the collector barrier. The transition is essentially collision free since the thickness of the field induced base region is less than the mean free path of an electron. Hence, no significant additional electrons will be lost in the base.

Figure 3:
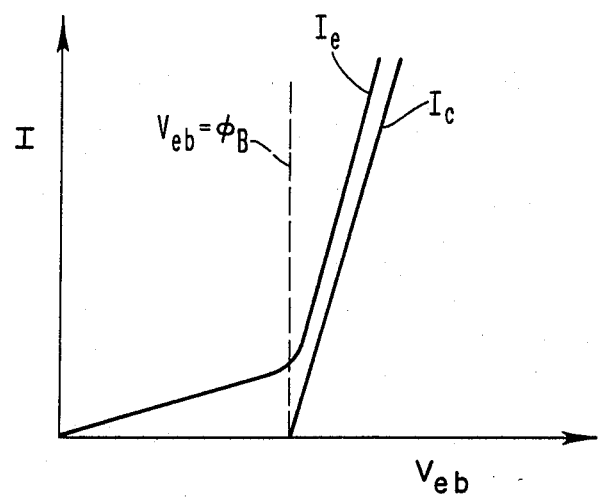
FIG. 3 is a graph of the electrical operating characteristics of the structure of the invention.

The electrical operating characteristics of the device are shown in FIG. 3.

Refferring next to FIG. 3, the result of the performance is that both the emitter and collector current $I_e$ and $I_c$ will increase rapidly giving the device power gain once the collector barrier $\phi_B$ as shown dotted in FIG. 3 has been surmounted.

One skilled in the art in fabricating a device with the specifications employed in this invention would conveniently employ the well known technique of molecular beam epitaxy (MBE). Since small dimensions are achievable with this technique and the temperatures employed are not so high as to move the impurity significantly. The MBE technique has been available for a number of years and it enables one skilled in the art to grow in an epitaxial manner semiconductors with thicknesses as small as around 20 Angstroms and to produce sharp boundaries of the order of 5 Angstroms. With molecular beam epitaxy, the epitaxial heterojunction interface can be achieved in a dimension of around 5 Angstroms from a doping of around $10^{17}$ in the region 1 to around $10^{15}$ in region 2 and the thickness of the region 2 can be confined to something less than 1,000 Angstroms to the interface of the region 3 at which a doping level change to around $10^{19}$ can take place.

The fabrication of contacts to the various electrodes are done employing standard photolithographic processes.

What has been described is the technique of providing a high speed transistor through the use of the accumulation and depletion region in a heterojunction formed between two different bandgap semiconductors as the base for ballistic majority carrier transfer.

Having thus described my invention, what I claim as new and desire to secure by Letters Patent is:

1. A semiconductor three terminal device having
a monocrystalline semiconductor substrate of a larger band gap semiconductor material having a specific extrinsic conductivity type having a high conductivity level,
a first layer of monocrystalline semiconductor material
having opposing faces separated by a dimension in excess of the means free path distance of an electron in said material,
having a first face thereof epitaxial with said substrate at an interface,
having a band gap smaller than said larger band gap, and
having said specific extrinsic conductivity type having a conductivity that is lower than said high conductivity level,
a second layer of monocrystalline semiconductor material epitaxial with said second face of said layer,
having a band gap smaller than said larger band gap, and
having said specific extrinsic conductivity type having a conductivity that is higher than said high conductivity level,
a region of said specific extrinsic conductivity type having said high conductivity level extending from an external surface into said first layer to the vicinity of said interface, and
ohmic electrical signal contact means to each of said substrate, said second layer and said region.

2. A ballistic transport transistor comprising:
a first layer containing doping impurities of a specific conductivity type at a first level,
a second layer of a second semiconductor material different from said first semiconductor material, said second layer having said specific conductvity type and being less heavily doped than said first layer, said second layer having an interface with said first layer, the workfunctions and forbidden gaps of said first and second layers being such that a portion of said second layer adjacent said interface contains current carriers of said specific conductivity type due to the doping in said first layer adjacent said interface,
a third layer of semiconductor material having said specific conductivity type and being doped to contain carriers of said specific conductivity type, said third layer being separated from said first layer by said second layer, such that said portion of said second layer lies between said first layer and said third layer,
means for contacting said first layer, means contacting said third layer, and means for providing electrical connection in said portion of said second layer,
said portion of said second layer containing said current carriers being thinner, in a direction measured along a line extending perpendicularly from said interface, than the mean free path of said current carriers in said portion,
whereby upon application of a voltage between said third layer and said means for providing electrical connection to said portion of said second layer of such polarity as to cause current carriers of said specific conductivity type to move from said third layer toward said portion, at least some of said current carriers which were caused to move can pass through said portion into said first layer without scattering in said portion.

3. A ballistic transport transistor comprising:
a first layer of a first semiconductor material, said first layer containing doping impurities of a specific conducitvity type at a first level,
a second layer of a second semiconductor material different from said first semiconductor material, said second layer having said specific conductivity type and being less heavily doped than said first layer, said second layer having an interface with said first layer, the forbidden gaps of said first and second layers being such that a portion of said second layer adjacent said interface contains current carriers of said specific conductive type due to the doping in said first layer adjacent said interface, a third layer of semiconductor material being doped to contain carriers of said specific conductivity type, said third layer being separated from said first layer by said second layer, such that said portion of said second layer lies between said first layer and said third layer, means for contacting said first layer, means contacting said third layer, and means for providing electrical connection in said portion of said second layer, said portion of said second layer containing said current carriers being thinner, in a direction measured along a line extending perpendicularly from said interface, than the means free path of said current carriers in said portion, whereby upon application of a voltage between said third layer and said means for providing electrical connection to said portion of said second layer of such polarity as to cause current carriers of said specific conductivity type to move from said third layer toward said portion, at least some of said current carriers which were caused to move can pass through said portion into said first layer without scattering in said portion.

4. A semiconductor signal translating device comprising in combination a specific conductivity type monocrystalline semiconductor body having first and second essentially planar regions joined at an epitaxial interface said first region having a larger bandgap and a higher conductivity, said second region having a smaller bandgap than said first region and a lower conductivity, a high conductivity region forming an ohmic contact with the portion of said second region adjacent said interface, and bias means applied to produce conduction across said interface.

5. The three terminal device of claim 1 wherein said substrate is n+ GaAlAs and said first layer is n− GaAs.

6. The three terminal device of claim 5 wherein said second layer is n+ GaAs.

7. The three terminal device of claim 6 wherein said substrate is doped to a level of $10^{17}$ atoms/cc with As, said first layer is doped to a level of $10^{15}$ atoms per cc with As, said opposing faces being separated by a distance of 1000 Angstroms, and said second layer is doped to a level of $10^{18}$ atoms per cc with As.

8. The device of claim 4 including a third semiconductor region having a smaller bandgap than said first region, having a higher conductivity than said second region, separated from said interface a distance greater than the mean free path distance of a carrier in said semiconductor material, and said third semiconductor region being included in said bias means.

9. The device of claim 8 wherein said first region is GaAlAs and said second and said third regions are GaAs.

* * * * *